United States Patent [19]

Arakawa

[11] Patent Number: 5,189,641
[45] Date of Patent: Feb. 23, 1993

[54] NON-VOLATILE RANDOM ACCESS MEMORY DEVICE

[75] Inventor: Hideki Arakawa, Yokohama, Japan

[73] Assignee: Fujitsu Limited, Kawasaki, Japan

[21] Appl. No.: 609,096

[22] Filed: Nov. 5, 1990

Related U.S. Application Data

[63] Continuation of Ser. No. 203,921, Jun. 8, 1988, abandoned.

[30] Foreign Application Priority Data

Jun. 8, 1987 [JP] Japan ................. 62-141443

[51] Int. Cl.$^5$ ............................................. G11C 7/00
[52] U.S. Cl. .................................. 365/228; 365/190; 365/185
[58] Field of Search ................. 365/186, 154, 182, 228, 365/190

[56] References Cited

U.S. PATENT DOCUMENTS

| | | | |
|---|---|---|---|
| 4,354,255 | 10/1982 | Stewart | 365/85 X |
| 4,630,238 | 12/1986 | Arakawa | 365/185 |
| 4,635,229 | 1/1987 | Okumura et al. | 365/185 X |
| 4,706,220 | 11/1987 | Spence | 365/154 X |
| 4,800,533 | 1/1989 | Arakawa | 365/228 |
| 4,802,124 | 1/1989 | O'Brien, Jr. | 365/185 |

FOREIGN PATENT DOCUMENTS

| | | |
|---|---|---|
| 0182595 | 5/1986 | European Pat. Off. . |
| 0200480 | 11/1986 | European Pat. Off. . |
| 0033392 | 2/1987 | Japan ................. 365/185 |

Primary Examiner—Andrew L. Sniezek
Attorney, Agent, or Firm—Staas & Halsey

[57] ABSTRACT

A semiconductor memory device includes a memory cell including a volatile memory cell portion having a flip-flop and a non-volatile memory cell portion individually and respectively associated with the volatile memory cell portion and including a capacitor portion operatively connected to the volatile memory cell portion, a memory transistor operatively connected to the capacitor portion, and a recall transistor connected between the memory transistor and one of a pair of nodes of the flip-flop and selectively turned ON in a recall operation.

The capacitor portion comprises a tunnel capacitor, used in a store operation, connected in series with a further capacitor and to which is applied a difference voltage between the respective voltages appearing at the pair of nodes. The space occupied by the memory cells on a chip is reduced and the degree of integration of the circuit is increased.

4 Claims, 9 Drawing Sheets

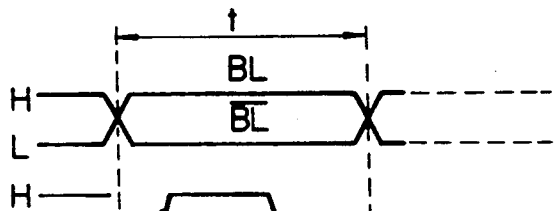
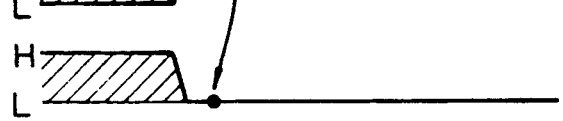
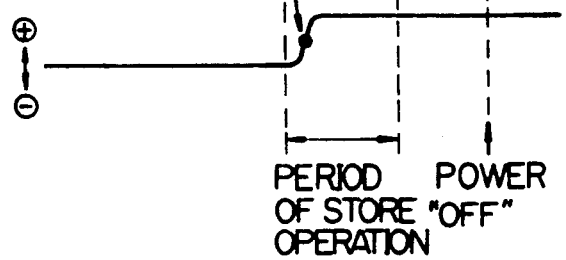

WHEN $(N_1, N_2) = (H, L)$, I.E., MODE 1

WHEN $(N_1, N_2) = (L, H)$, I.E., MODE 2

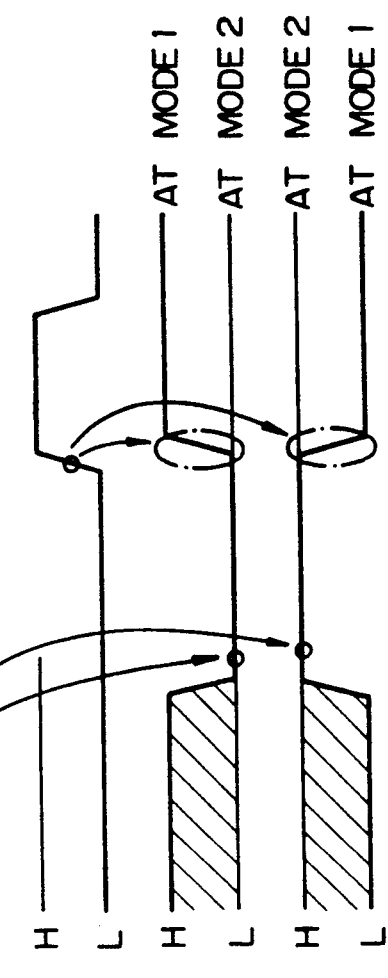
Fig.8a  RECALL CONTROL SIGNAL RCo
Fig.8b  POTENTIAL AT BIT LINE
Fig.8c  POTENTIAL AT WORD LINE
Fig.8d  RECALL SIGNAL RCL
Fig.8e  POTENTIAL AT NODE N1
Fig.8f  POTENTIAL AT NODE N2

NON-VOLATILE RANDOM ACCESS MEMORY DEVICE

This is a continuation of copending application Ser. No. 07/203,921 filed on Jun. 8, 1988 now abandoned.

Cross-Reference to Related Application

This application is related to U.S. Ser. No. 016,729 now U.S. Pat. No. 4,799,194 filed Feb. 20, 1987 entitled "Semiconductor Nonvolatile Memory Device."

BACKGROUND OF THE INVENTION

1. Field of the Invention

The present invention relates to a semiconductor memory device and, more particularly, to a memory device in the form of a non-volatile random access memory (NVRAM), in which a volatile memory cell, for example, a static RAM(SRAM) cell or dynamic RAM(DRAM) cell, and a non-volatile memory cell using a floating gate circuit element, for example, an electrically erasable and programmable read only memory (EEPROM) cell, are combined on a one-to-one basis on a chip.

Since an NVRAM possesses both a function of an SRAM, i.e., a high speed read/write operation, and a feature of an EEPROM, i.e., non-volatility, it has been utilized in fields in which, even when a power source is OFF, data is not lost but stored, and when the power source is ON, the data can be freely erased and reprogrammed.

2. Description of the Related Art

In the above NVRAM, when the power source is ON, the SRAM carries out a read/write operation in the same way as a conventional SRAM, the data in the SRAM is stored in the EEPROM before the power source is turned OFF, and utilizing the non-volatile characteristic, the data is held therein while the power source is OFF. When the power source is again switched ON, the data in the EEPROM is recalled to the SRAM and the conventional read/write operation carried out. Accordingly, to realize such store and recall operations, a structure of each of the memory cell units including the SRAM cell and EEPROM cell is complicated, and therefore, the space occupied by the cells on the chip is increased, which leads to a lower reliability and degree of integration of the memory device. Therefore, an improvement by an appropriate design of the cell structure is required.

The store operation in the NVRAM is carried out by utilizing a tunnel effect occurring within an oxidation layer formed between a floating gate and a diffused region in the EEPROM cell. In the store operation, a strongly boosted voltage is employed and a portion thereof is applied across a tunnel capacitor representing an equivalent capacitance of the oxidation layer, with the result that positive or negative charges remain on the floating gate. Note, the positive charges correspond to "1" data and the negative charges to "0".

In the known EEPROM cell, several capacitors other than the tunnel capacitor are parasitically formed in a series connection with the tunnel capacitor, which will be described later. Accordingly, when the strongly boosted voltage for storing data into the EEPROM cells is applied to each of the cells, one portion of the voltage is applied across the tunnel capacitor and the other portion thereof is applied across the parasitically formed capacitors. Namely, to carry out the store operation, a voltage higher than the voltage necessary for electrifying the floating gate to store data must be provided as the strongly boosted voltage.

Therefore, when the non-volatile memory cells including floating gate circuit elements are integrated on a substrate, a region for cutting a channel must be made large or a potential barrier at the junction between the diffused region in the substrate and the gate must be made high, so that each element can withstand the application of the strongly boosted voltage. This, however, is detrimental to a high degree of integration and thus not desirable.

Also, when any one of the tunnel capacitor and other parasitically formed capacitors is destroyed, the whole boosted voltage is lowered, and accordingly, a sufficient voltage necessary for storing data cannot be obtained.

SUMMARY OF THE INVENTION

An object of the present invention is to provide a semiconductor memory device in which the number of capacitors formed, in a non-volatile memory cell portion is decreased, thereby to reduce the space occupied by memory cells on the chip, and accordingly, raise the degree of integration of the circuit.

According to one aspect of the present invention, there is provided a semiconductor memory device including a plurality of memory cells, each of the memory cells comprising: a volatile memory cell portion including a flip-flop having a pair of first and second nodes connected to a corresponding pair of bit lines via respective transfer gate transistors; a non-volatile memory cell portion including a capacitor portion connected between the first and second nodes; a memory transistor having a gate connected to the capacitor portion, and a recall transistor connected between the memory transistor and one of the first and second nodes and being turned ON when data is recalled from the non-volatile memory cell portion to the volatile memory cell portion; and a voltage supply unit connected to the flip-flop for supplying a first power supply voltage during read/write operation of the volatile memory cell portion, and supplying a second power supply voltage higher than the first power supply voltage to the capacitor portion via the flip-flop, whereby a tunnel effect is caused in the capacitor portion and data in the volatile memory cell portion is stored in the non-volatile memory cell portion.

Also, according to another aspect of the present invention, there is provided a semiconductor memory device including a memory cell array having a memory cell at each intersection between a plurality of word lines and bit lines, the memory cell including: a volatile memory cell portion having a flip-flop arrangement and carrying out a read/write operation of data between a pair of nodes and a pair of bit lines wherein, when a predetermined high voltage is applied to the flip-flop arrangement, a difference voltage between the respective voltages appearing at the pair of nodes is set to substantially the value of the high voltage; and a non-volatile memory cell portion individually and respectively associated with the volatile memory cell portion on and including a capacitor circuit operatively connected to the volatile memory cell portion, the capacitor circuit having a capacitor and a tunnel capacitor connected in series between the pair of nodes and receiving the difference voltage, a tunnel effect occurring in accordance with the voltage thereby applied to the tunnel capacitor, a memory transistor having a gate connected to a common junction of the capacitor and tunnel capacitor, the common junction being in a floating state, and a switching transistor connected between the memory transistor and one of the pair of nodes and being turned ON in response to a control signal of a predetermined level, wherein, based on the application of the high voltage or the control signal, an operation of storing data from the volatile memory cell portion to the non-volatile memory cell portion or an operation of recalling the data from the non-volatile memory cell portion to the volatile memory cell portion selectively is carried out.

BRIEF DESCRIPTION OF THE DRAWINGS

Other objects and features of the present invention will be described hereinafter in detail by way of the preferred embodiments with reference to the accompanying drawings, in which:

FIGS. 6a to 6g are waveform diagrams for explaining a store operation of the device shown in FIG. 3;

FIGS. 8a to 8f are waveform diagrams for explaining a recall operation of the device shown in FIG. 3.

DESCRIPTION OF THE PREFERRED EMBODIMENTS

For a better understanding of the preferred embodiments, the problems of the prior art will now be explained with reference to FIG. 1.

Note, in the following description, the term "transistor" is used to define an enhancement type N-channel metal oxide semiconductor (NMOS) field effect transistor, and this a special definition is intended hereafter.

Figure 1:
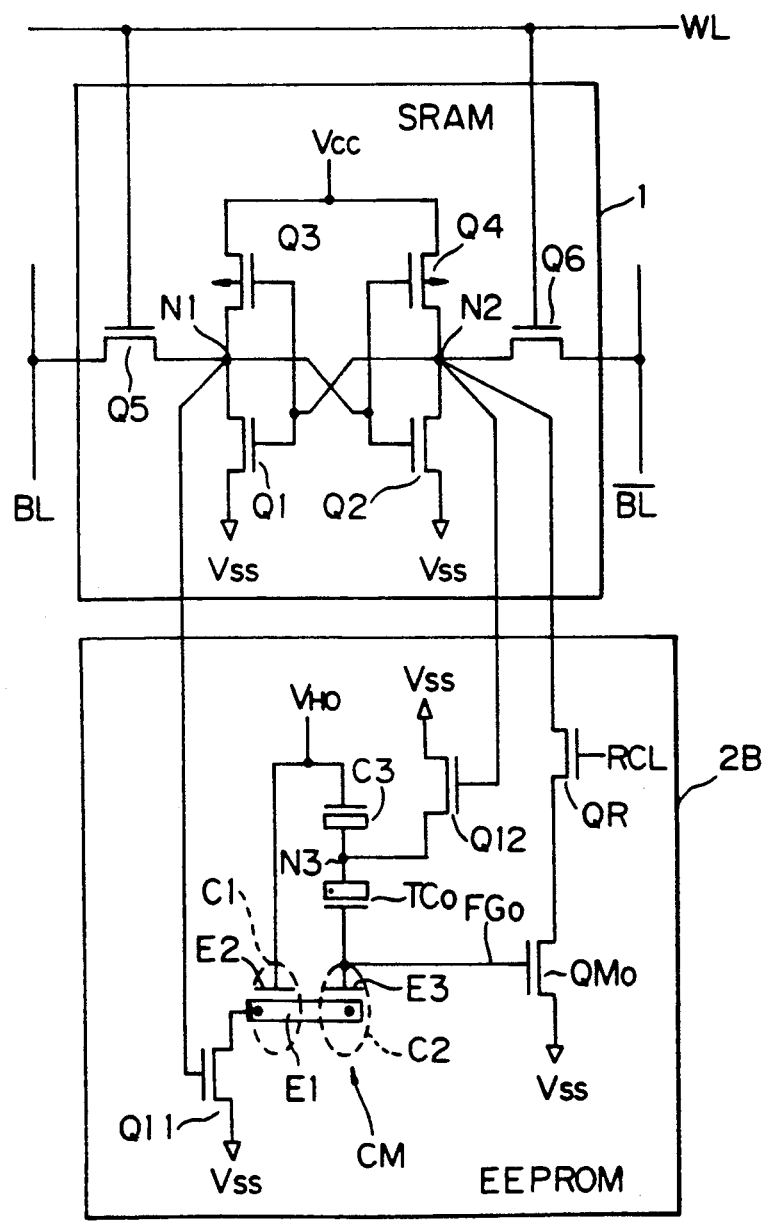
FIG. 1 is a circuit diagram illustrating a constitution of a memory cell employed in an example of the prior art NVRAM device.

FIG. 1 shows a circuit constitution of a memory cell employed in an example of the prior art NVRAM device. The memory cell includes a volatile memory cell portion 1, i.e., an SRAM in the illustrated example, and a non-volatile memory cell portion 2B, i.e., an EEPROM in the illustrated example.

The volatile memory cell portion 1 includes a flip-flop type arrangement having transistors Q1~Q4 as in the conventional SRAM device. A read/write operation of data is carried out between nodes N1, N2 and the corresponding bit lines BL, $\overline{BL}$ through transfer gate transistors Q5, Q6.

The non-volatile memory cell portion 2B includes transistors Q11, Q12, a transistor QR which turns ON in response to a control signal RCL in a recall operation, a memory transistor $QM_0$ in which a gate $FG_0$ is maintained in a floating state, a capacitor module CM, a capacitor C3, and a tunnel capacitor $TC_0$ as a floating gate circuit element. In the capacitor module CM, capacitors C1 and C2 are formed between an electrode E1 and electrodes E2 and E3, respectively. The electrode E1 corresponds to a diffused region constituting a source/drain (S/D) in the semiconductor substrate, and the electrodes E2 and E3 correspond to gates. Also, the capacitance of the tunnel capacitor $TC_0$ is made smaller than that of any one of the capacitors C1, C2 and C3, taking the store operation into consideration.

Next, the store and recall operation of the device shown in FIG. 1 will be described.

A. Store Operation

Assuming that the node N1 is at "L" level and the node N2 is at "H" level, when the power supply voltage $VH_0$ is raised to 25~30 V, the transistor Q11 is brought to the OFF state and the transistor Q12 is brought to the ON state. Accordingly, the node N3 is lowered to "L" level, i.e., effectively a potential of $V_{SS}$, and the power supply voltage $VH_0$ is applied to a series circuit of the capacitor C1, C2 and $TC_0$. As previously described, since the capacitance of the capacitors C1 and C2 is greater than that of the capacitor $TC_0$, a greater portion of the voltage $VH_0$ is applied across the tunnel capacitor $TC_0$. As a result, electrons are injected from the node N3 to the gate $FG_0$ due to the tunnel effect, and accordingly, negative charges are accumulated in the floating gate circuit of the memory transistor $QM_0$.

Likewise, where the node N1 is at "H" level and the node N2 is at "L" level, positive charges are accumulated in the gate $FG_0$.

B. Recall Operation

First, the potentials at bit lines BL and $\overline{BL}$ are settled or preset to predetermined levels and a potential at a word line WL is raised to the "H" level. Accordingly, the transistors Q5 and Q6 are turned ON and the nodes N1 and N2 are settled to predetermined levels in accordance with the potentials at the bit lines BL and $\overline{BL}$. Assuming that the node N1 is "L" level and the node N2 is "H" level, the control signal RCL is raised to "H" level. If negative charges are accumulated in the gate $FG_0$, the transistor $QM_0$ is turned OFF and the source of the transistor QR is electrically separated from the lower power supply line $V_{SS}$. Accordingly, the potential at the node N2 is maintained "H" level. Conversely, the potential at the node N1 is maintained "L" level, and as a result, the flip-flop circuit is preset.

Likewise, if positive charges are accumulated in the gate $FG_0$, the transistors $QM_0$ and QR are turned ON, and accordingly, the node N2 is pulled down to "L" level and the node N1 is pulled up to "H" level.

According to the constitution of the non-volatile memory cell portion 2B shown in FIG. 1, the voltage across the tunnel capacitor $TC_0$, normally 12~15 V, is provided by dividing the power supply voltage $VH_0$, normally 25~30 V, in accordance with the ratio of the respective capacitances of the capacitors C1, C2, and C3. Namely, although the voltage necessary for storing data is 12~15 V at the highest, to obtain this voltage, a power supply voltage $VH_0$ (25~30 V) higher than the voltage actually necessary for storing data (12~15 V) must be prepared.

Therefore, the non-volatile memory cell portion must be formed in a relatively large size on a chip so that it can withstand the application of the high voltage $VH_0$.

This means that the degree of integration is lowered, and thus is not desirable.

A preferred embodiment of the present invention will now be described in detail with reference to FIGS. 2 to 8f.

Figure 2:
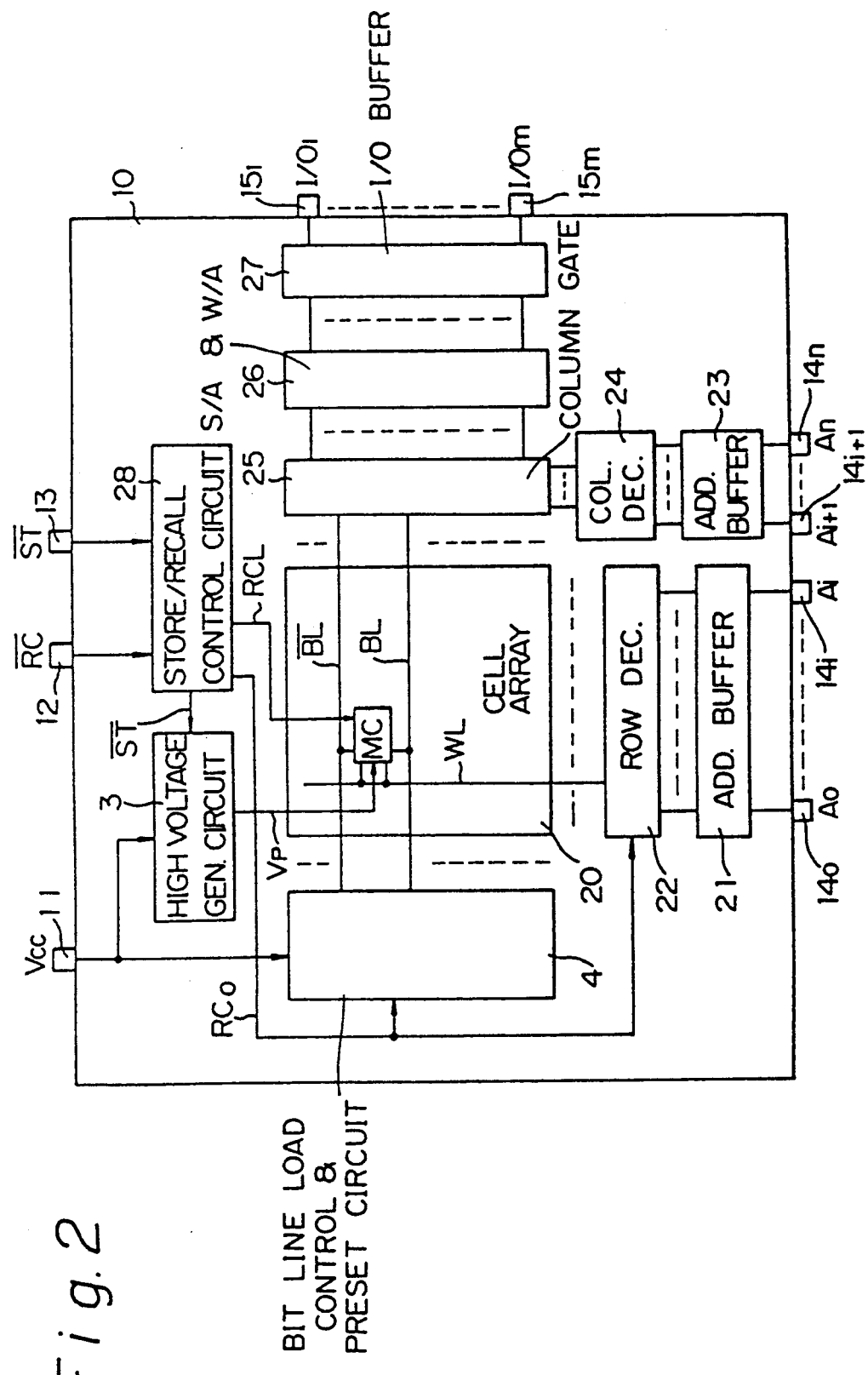
FIG. 2 is a block diagram schematically showing a NVRAM device in accordance with an embodiment of the present invention.

FIG. 2 schematically illustrates the constitution of the NVRAM device as an embodiment of the present invention.

In FIG. 2, 10 denotes an NVRAM device in the form of a chip; 11 a pin terminal for receiving a higher power supply voltage $V_{CC}$ (5 V); 12 a pin terminal for receiving a signal $\overline{RC}$ for controlling a recall operation; 13 a pin terminal for receiving a signal $\overline{ST}$ for controlling a store operation; $14_0 \sim 14_i$ pin terminals for receiving row address signals $A_0 \sim A_i$; $14_{i+1} \sim 14_n$ pin terminals for receiving column address signals $A_{i+1} \sim A_n$; and $15_1 \sim 15_m$ pin terminals for transmitting input/output (I/O) signals $I/O_1 \sim I/O_m$.

Reference 20 denotes a memory cell array having a memory cell MC provided at each intersection between a plurality of word lines WL and a plurality of pairs of bit lines BL and $\overline{BL}$. A concrete constitution of the memory cell MC will be described later. Reference 21 denotes an address buffer for buffering the row address signals $A_0 \sim A_i$ input through the pin terminals $14_0 \sim 14_i$; 22 denotes a row decoder, which selects one of the word lines WL based on the row address designation in the read/write operation and selects all of the word lines WL in response to a recall control signal $RC_0$ in the recall operation; 23 denotes an address buffer for buffering the column address signals $A_{i+1} \sim A_n$ input through the pin terminals $14_{i+1} \sim 14_n$; 24 denotes a column decoder for selecting one of the pairs of bit lines BL and $\overline{BL}$ based on the column address designation in the read/write operation; 25 denotes a column gate for passing data on the pair of bit lines selected by the column decoder 24; 26 denotes a sense amplifying (S/A) and write amplifying (W/A) circuit for amplifying the read-out data or input data; and 27 denotes an I/O buffer for buffering the read-out data or input data.

Reference 28 denotes a store/recall control circuit, which outputs the recall control signal $RC_0$ and then a recall signal RCL in response to the signal $\overline{RC}$ input through the pin terminal 12, and outputs a low active store signal $\overline{ST}$ in response to the signal $\overline{ST}$ input through the pin terminal 13. Reference 3 denotes a high voltage generating circuit, which receives the power supply voltage $V_{CC}$ input through the pin terminal 11 and generates a variable high voltage $V_P$ in response to the store signal ST. The high voltage $V_P$ has a value of $V_{CC}$ (5 V) necessary for the read/write operation or a value of $V_{HH}$ (18~22 V) necessary for the store operation. A concrete constitution and operation of the high voltage generating circuit 3 will be described later. Reference 4 denotes a bit line load control and preset circuit, which receives the power supply voltage $V_{CC}$, functions as a bit line load, and presets the potential of each of the bit lines BL and $\overline{BL}$ to a predetermined level in response to the recall control signal $RC_0$, prior to the recall operation.

Next, a circuit constitution of the memory cell MC shown in FIG. 2 will be described in detail with reference to FIG. 3.

The memory cell consists of a volatile memory cell portion 1, i.e., an SRAM, and a non-volatile memory cell portion 2, i.e., an EEPROM. The volatile memory cell portion 1 is operatively connected to the high voltage generating circuit 3 and the bit line load control and preset circuit 4.

The volatile memory cell portion 1 is constituted by a flip-flop type arrangement as in the conventional SRAM device, i.e., an SRAM cell having two N-channel transistors Q1 and Q2 and two P-channel transistors Q3 and Q4, and two transfer gate transistors Q5 and Q6 connected between the nodes N1 and N2 of the cell and the bit lines BL and $\overline{BL}$, respectively. The volatile memory cell portion 1 carries out a read/write operation of data between the nodes N1 and N2 and the corresponding bit lines BL and $\overline{BL}$ through the transfer gates Q5, Q6.

The non-volatile memory cell portion 2 includes a recall transistor QR, a memory transistor QM, and a capacitor circuit FC. The capacitor circuit FC and the memory transistor QM constitute a non-volatile memory cell, i.e., an EEPROM cell.

The capacitor circuit FC is composed of the diffused region S/D constituting a source/drain (S/D) in the semiconductor substrate, a floating gate FG formed via a tunnel insulation film (not shown in FIG. 3) on the diffused region S/D, and a control gate CG formed via an insulation film (not shown in FIG. 3) on the gate FG. A tunnel capacitor TC is formed between the diffused region S/D and the floating gate FG, and a capacitor $C_f$, corresponding to the capacitor C2 shown in the prior art of FIG. 1, is formed between the floating gate and the control gate CG. The diffused region S/D and control gate CG are connected to the nodes N1 and N2, respectively, in the volatile memory cell portion 1, and the floating gate FG is connected to a gate of the memory transistor QM. The source of the memory transistor QM is connected to a lower power supply line $V_{SS}$ (0 V), and the drain thereof is connected via the recall transistor QR to the node N2 in the volatile memory cell portion 1. The recall transistor QR is employed when data stored in the non-volatile memory cell portion 2 is recalled to the volatile memory cell portion 1, i.e., when the power source is turned ON, and turned ON in response to the "H" level recall signal RCL.

On the other hand, the bit line load control and preset circuit 4 includes a transistor 41 as a load of the bit line BL, a transistor 42 as a load of the complementary bit line $\overline{BL}$, and a transistor 43 for pulling the potential of the bit line BL down to the level of $V_{SS}$ (0 V) in response to the "H" level recall control signal $RC_0$.

Figure 3:
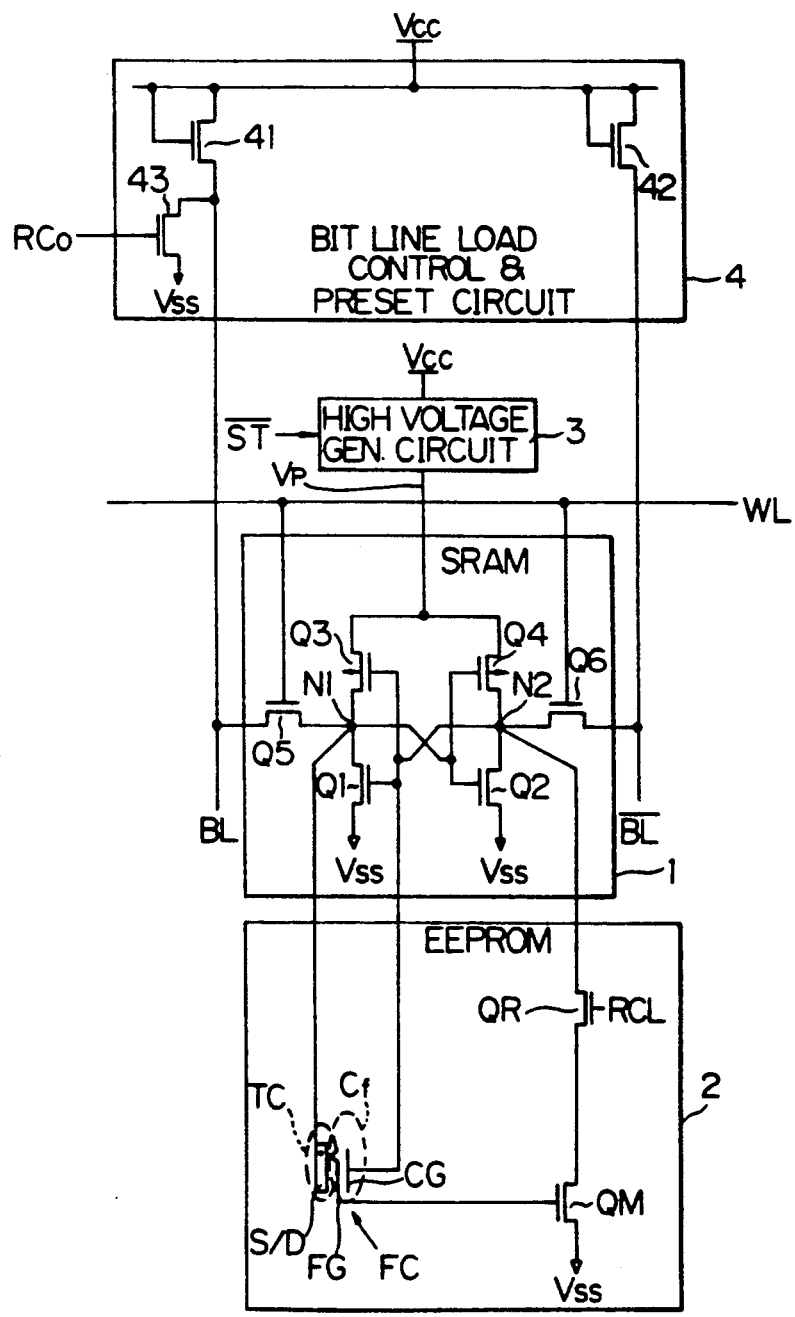
FIG. 3 is a circuit diagram illustrating a constitution of the memory cell shown in FIG. 2.
Figure 4:
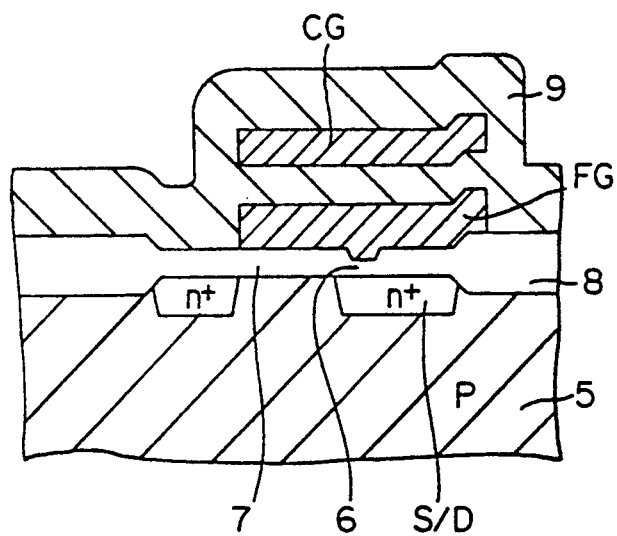
FIG. 4 is a sectional view showing an example of the capacitor circuit shown in FIG. 3.

FIG. 4 shows a section of an example of the capacitor circuit FC shown in FIG. 3. In FIG. 4, 5 denotes a P type semiconductor substrate; 6 a tunnel oxidation film of $SiO_2$ having a thickness of approximately 100 Å (10 nm); 7 a gate oxidation film of $SiO_2$ used for the memory transistor QM (not shown in FIG. 4); 8 a field oxidation film of $SiO_2$; and 9 an insulation layer for insulating the control gate CG from the floating gate FG. The thickness of the oxide layer 9 between the gates FG and CG is selected to be approximately 500 to 600 Å (50 to 60 nm). In FIG. 4, the tunnel capacitor TC (see FIG. 3) is formed between the floating gate FG and the diffused region S/D, and the capacitor $C_f$ (see FIG. 3) is formed between the gate FG and the control gate CG.

According to the constitution of the memory cell shown in FIG. 3, the voltage necessary for storing data, i.e., the voltage (normally 12~15 V) across the tunnel capacitor TC, is fed by dividing the voltage appearing across the nodes N1 and N2 in the store operation, i.e., the strongly boosted voltage $V_{HH}$, in accordance with the inverse ratio of the respective capacitances of the capacitor $C_f$ and tunnel capacitor TC. Compared with the constitution of the memory cell shown in the prior art of FIG. 1, the number of capacitors formed in the non-volatile memory cell portion in FIGS. 3 and 4 is decreased from three (C1, C2, C3 in FIG. 1) to one ($C_f$). Therefore, the value of the power supply voltage $V_{HH}$ necessary for the store operation can be made lower than the voltage VH$_0$ (25~30 V) in the prior art, i.e., the lower voltage of around 18~22 V as previously stated. This means that strength of a cell able to withstand the voltage application required for the store operation in accordance with the invention need not be so high as in the prior art, and thus the space occupied by the cells on the chip is relatively decreased. Accordingly, it is possible to raise the degree of integration of the circuit.

Figure 5:
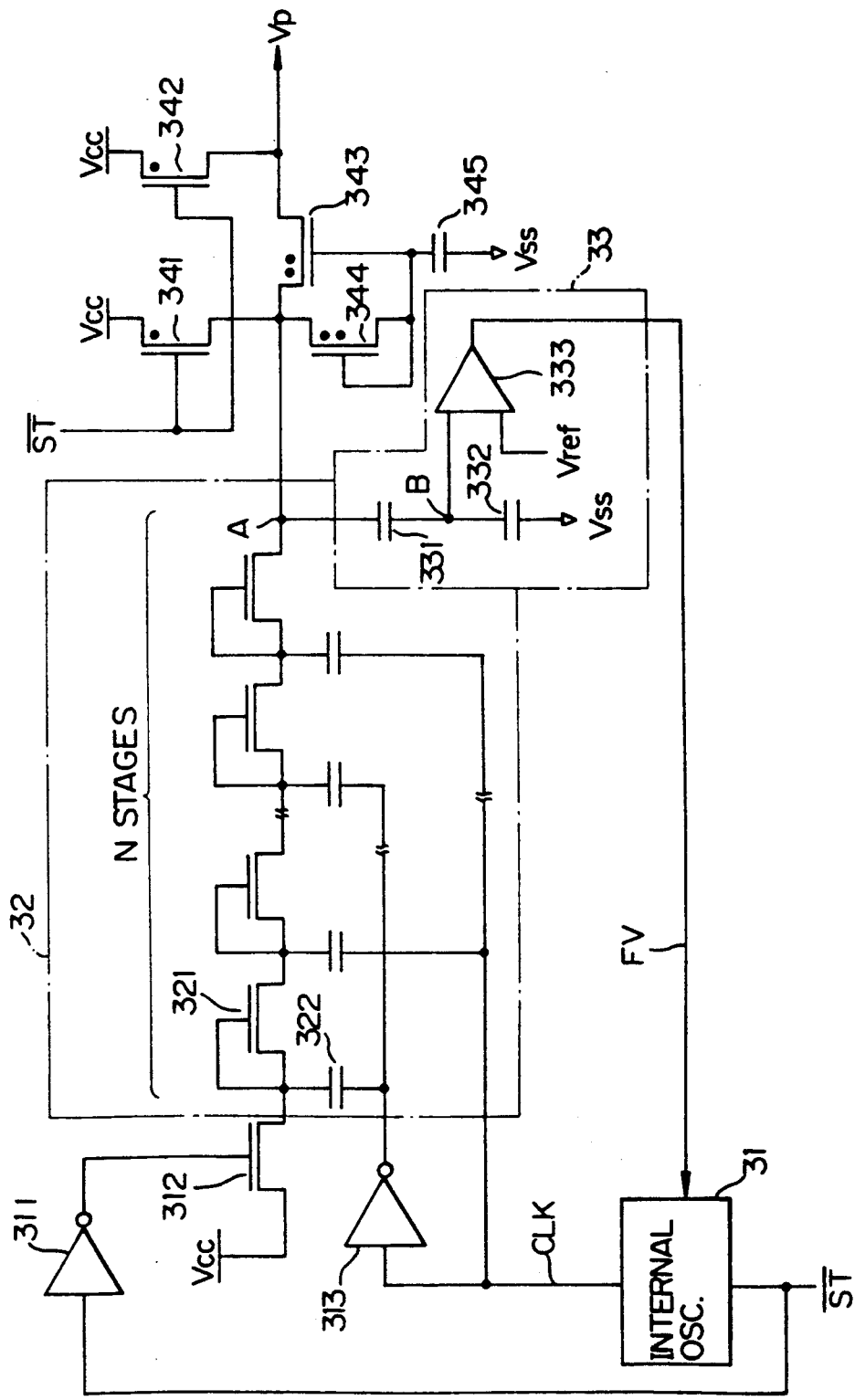
FIG. 5 is a circuit diagram illustrating a constitution of the high voltage generating circuit shown in FIGS. 2 and 3.

Next, a concrete circuit constitution and operation of the high voltage generating circuit 3 will be explained with reference to FIG. 5. The circuit of FIG. 5 comprises an internal oscillating circuit 31, a boosting circuit 32, and a voltage control circuit 33, as main constituent elements.

The internal oscillating circuit 31 has a fundamental function of being brought to the enable state in response to the "L" level store signal ST and of oscillating to produce a chain of clocks CLK. Additionally, the circuit 31 stops oscillating and outputting the clocks CLK when the potential at the node A reaches a predetermined level. The store signal ST is fed via an inverter 311 to gate of a transistor 312, which is turned ON in response to the "L" level store signal $\overline{ST}$ and feeds the power supply voltage $V_{CC}$ (5 V) to the boosting circuit 32.

The boosting circuit 32 has a Cockcroft-type constitution including plural CRT circuits, each CR circuit consisting of a transistor 321 functioning as a resistor and a capacitor 322, of N stages (10~20 stages). Alternate stages of the CR circuits are supplied with the clock output CLK of the internal oscillating circuit 31, or via an inverter 313 with the clock output CLK. As a result, the boosting circuit 32 outputs a boosted voltage (20 V) at the node A in response to the power supply voltage $V_{CC}$ and the "L" level store signal ST.

The voltage control circuit 33 includes capacitors 331 and 332 as a voltage dividing means connected between the node A and the power supply line $V_{SS}$ (0 V), and an operational amplifier 333 for comparing and amplifying the voltage at the junction (node B) of the capacitors, which is preset to be 2 V, relative to a reference voltage $V_{ref}$ (2 V). The circuit 33 feeds the output of the operational amplifier 333 back to the internal oscillating circuit 31 as a signal FV.

Furthermore, an output stage circuit is connected between the node A and an output end ($V_P$), comprising a depletion type transistor 341 which is connected between the node A and the power supply line $V_{CC}$ and to the store signal $\overline{ST}$, a depletion type transistor 342 which is connected between the output end ($V_P$) and the power supply line $V_{CC}$ and responds to the store signal $\overline{ST}$, a depletion type transistor 343 which is connected between the node A and the output end ($V_P$) a depletion type transistor 344 which is connected between a gate and a drain of the transistor 343, and a capacitor 345 which is connected between the gate of the transistor 343 and the power supply line $V_{SS}$. The threshold voltage each of the transistors 341 and 342 is made −3 V or more, and that of the transistors 343 and 344 is made −5 V or less. The output stage circuit has a function of smoothing the rise from 5 V to 20 V in the voltage appearing at the node A, and reducing the time required for switching between the voltage (20 V) in the store operation and the voltage (5 V) in the recall operation.

Next, the store and recall operation of the device shown in FIG. 3 will be described with reference to FIGS. 6a to 8f.

(1) Store Operation (see FIGS. 6a to 6f, and FIGS. 7a and 7b)

Assume that the potential at the word line WL is raised to the "H" level (see FIG. 6b) within the time period during which the potential at the bit line BL is "H" level and a potential at the bit line $\overline{BL}$ is "L" level (i.e., FIG. 6a). In this state, the transistors Q5 and Q6 are turned ON, and accordingly, the node N1 is "H" level (i.e., FIGS. 6c and 6d) and the node N2 is "L" level. Note, the hatched portion in the illustrated drawing indicates an uncertain state of the potential. In this state, when the store signal $\overline{ST}$ is lowered to "L" level (FIG. 6c), the internal power supply voltage $V_P$ is changed from the voltage $V_{CC}$ of 5 V to the voltage $V_{HH}$ of 20 V (FIG. 6c), and as a result, the voltage of 20 V appears at the node N1 and the voltage of 0 V appears at the node N2 (FIGS. 3 and 6g).

Figure 7A:
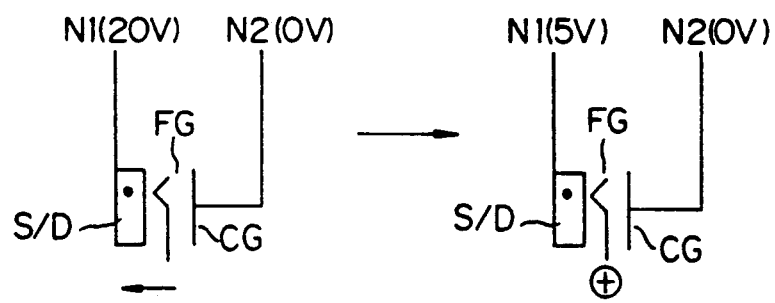
FIGS. 7a and 7b are views showing successive states of a memory in the EEPROM cell in the store operation.

Namely, the voltage of 20 V is applied across the diffused region S/D and the control gate CG in the polarity as shown in FIG. 7a, and thus electrons are injected by the tunnel effect from the floating gate FG to the node N1 (shown by an arrow mark). Next, when the store signal ST is returned to the "H" level, the movement of electrons ceases, so that the floating gate FG is "positively" electrified. This state corresponds to the state of the memory of the SRAM cell in which the nodes N1 and N2 are "H" level and "L" level, respectively. This state is hereinafter referred to as "mode 1".

Figure 7B:
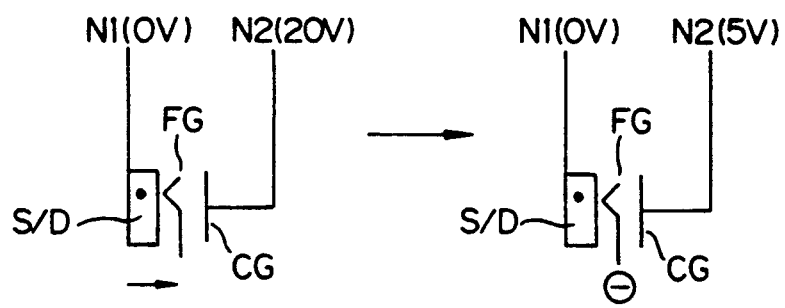

Therefore, where the potential at the word line WL is raised to the "H" level in a time period in which the potential at the bit line BL is "L" level and the potential at the bit line $\overline{BL}$ is "H" level, the nodes N1 and N2 are "L" level and "H" level, respectively, although not shown in FIGS. 6a to 6g. As a result, the floating gate FG is "negatively" electrified as shown in FIG. 7b. This state is hereinafter referred to as "mode 2".

As stated above, when the power source is turned OFF after the store operation, the content stored in the EEPROM cell when the power source is turned OFF is maintained because the state of electrification of the floating gate FG is not changed (see FIGS. 6f and 6g).

(2) Recall Operation (see FIGS. 8a to 8f)

First, the recall control signal RC$_0$ is raised to "H" level at a certain time and the potentials on all of the word lines WL are raised to "H" level (FIGS. 8a and 8c). In this state, the potential at the bit line BL is pulled down to "L" level by turning ON the transistor 43 (see FIG. 3), and the potential at the bit line $\overline{BL}$ is pulled up to "H" level by the transistor 42 (FIG. 8b). Since the transistors Q5 and Q6 are in the ON state, the node N1 settles at the "L" level and the node N2 settles at the "H" level. At this time, the SRAM cell is preset. When the recall signal RCL is then raised to "H" level (FIG. 8d), the recall transistor QR can be made ON.

In the state where "positive" charges are accumulated in the floating gate FG as shown in FIG. 7a, i.e., in the mode 1, the memory transistor QM is made ON, and accordingly, the potential at the source of the transistor QR is pulled down to the potential of $V_{SS}$ (0 V). When the transistor QR is turned ON, the potential at the node N2 is pulled down to "L" level, and when the node N2 is at "L" level, the transistor Q3 is turned ON, and accordingly, the potential at the node N1 is pulled up to "H" level.

Conversely, where "negative" charges are accumulated in the floating gate FG as shown in FIG. 7b, i.e., in the mode 2, the memory transistor QM is made OFF, and accordingly, the potential at the node N2 is maintained at the "H" level and the potential at the node N1 is maintained at the "L" level.

Namely, the state of the memory corresponding to the data stored into the EEPROM cell from the SRAM cell before the power source is turned OFF is recalled to the nodes N1 and N2 in the SRAM cell.

Figure 9:
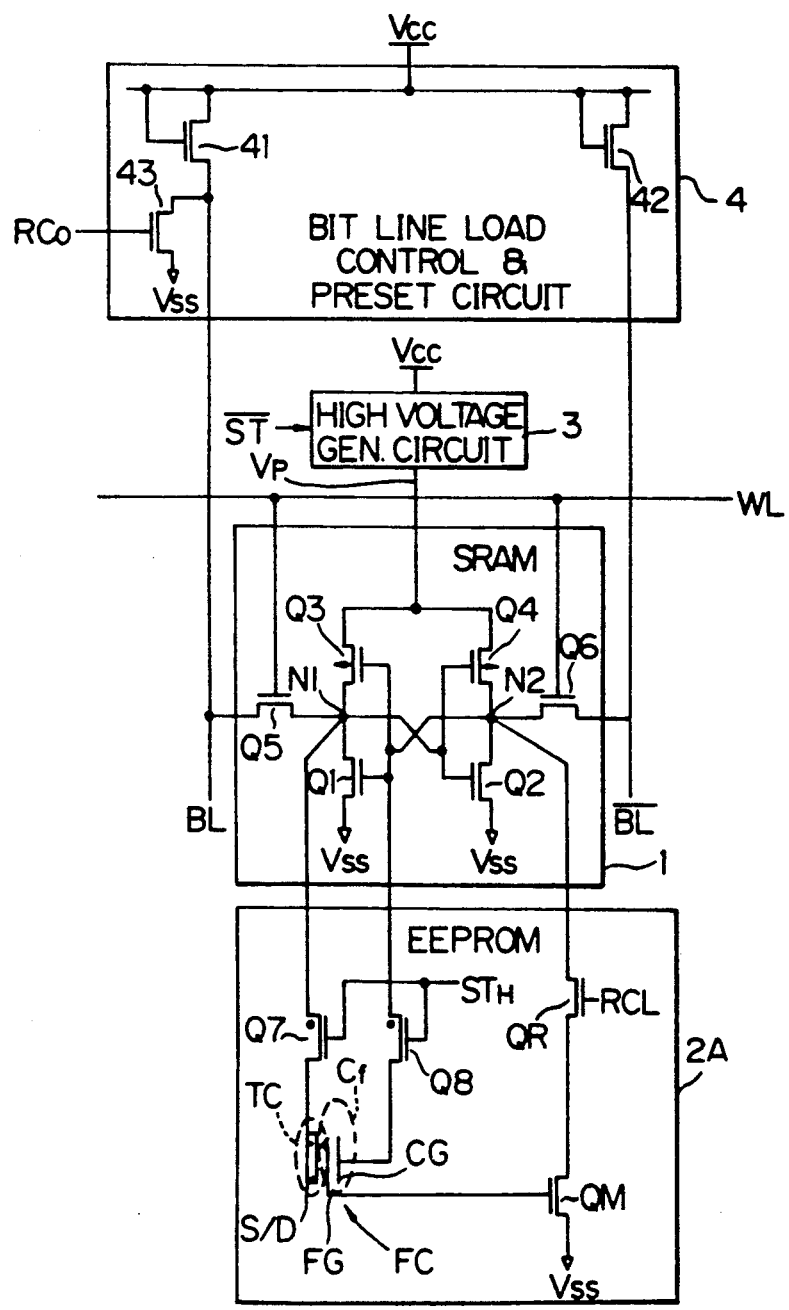
FIG. 9 is a circuit diagram illustrating a modification of the embodiment shown in FIG. 3.

FIG. 9 illustrates a circuit constitution of a modification of the embodiment shown in FIG. 3.

The differences between the present embodiment of FIG. 9 and the embodiment of FIG. 3 are as follows: first, a depletion type transistor Q7 is connected between the node N1 in the SRAM cell portion 1 and the diffused region S/D in the EEPROM cell portion 2A; second, a depletion type transistor Q8 is connected between the node N2 in the SRAM cell portion and the control gate CG in the EEPROM cell portion; and third, a control voltage $ST_H$ having a voltage of $V_{HH}$ (18~22 V) when the store signal $\overline{ST}$ is "L" level is applied to the respective gates of the transistors Q7 and Q8.

Since the remaining constitution is the same as in the embodiment of FIG. 3, an explanation thereof will be omitted.

The feature of the operation of the embodiment of FIG. 9 is that, except when the store operation is carried out, the SRAM cell side and the EEPROM cell side are electrically separated by the transistors Q7 and Q8. The separation is carried out for the following reason. Namely, where a constant voltage (normally 5 V) is fed as the power supply voltage $V_{CC}$, a deterioration occurs in the possible number of times that the re-programming can be repeated or in the data storing period. Accordingly, for example, the high voltage generating circuit as shown in FIG. 5 is employed and, a value of the power supply voltage $V_{CC}$ is changed to a voltage exceeding 5 V. In this case, taking the withstand strength of the cell against the applied voltage level into consideration, preferably the voltage fed to the cell is as low as possible except when the store operation is carried out. More preferably, the voltage is 0 V. The above electrical separation is carried out for the above reason.

Although, in the example illustrated in FIG. 9, the depletion type transistors Q7 and Q8 are employed in the non-volatile memory cell portion 2A, the conventional enhancement type transistors can be substituted therefor.

Also, although, in the disclosed and illustrated embodiments a flip-flop having a CMOS arrangement is employed in the volatile memory cell portion 1, a flip-flop having a NMOS arrangement can be substituted therefor.

Although the present invention has been disclosed and described by way of only two embodiments, it is apparent to those skilled in the art that other embodiments and modifications of the present invention are possible without departing from the spirit or essential features thereof.

I claim:

1. A semiconductor memory device including a plurality of memory cells formed in a semiconductor substrate and plural pairs of complementary bit lines formed thereon, each of said memory cells comprising:
   a volatile memory cell portion formed in said substrate and including a flip-flop having a pair of nodes and respective transfer gate transistors connecting said pair of nodes to a corresponding pair of said plural pairs of complementary bit lines;
   a non-volatile memory cell portion formed in said substrate and including:
      a capacitor circuit coupled across said pair of nodes and comprising a diffused region formed in said semiconductor substrate, a floating gate formed on a tunnel insulation layer in turn formed on said diffused region, and a control gate formed on an insulation layer in turn formed on said floating gate,
      a memory transistor formed in said substrate and having a gate connected to the floating gate,
      a recall transistor formed in said substrate and connected between said memory transistor and one of said pair of nodes and selectively operable, when turned ON, for recalling data from said non-volatile memory cell portion and supplying the recalled data to said volatile memory cell portion, and
   said non-volatile memory cell portion further including a first transistor coupled across one of said pair of nodes and said diffused region and a second transistor coupled across the other of said pair of nodes and said control gate, said first and second transistors being selectively turned ON for transferring data from said volatile memory cell portion to said non-volatile memory cell portion in a data store operation; and
   voltage supply means, connected to said flip-flop, for selectively supplying a first power supply voltage during a read/write operation of said volatile memory cell portion and a second power supply voltage, higher than said first power supply voltage, across said pair of nodes of said flip-flop and correspondingly across aid control gate and said diffused region, said second power supply voltage producing a tunnel effect in said capacitor circuit and thereby performing said data store operation of storing said data, transferred from said volatile memory cell portion to said non-volatile memory cell portion, in said non-volatile memory cell portion.

2. A device as set forth in claim 1, wherein said capacitor circuit comprises a first, tunnel capacitor between said diffused region and said floating gate and a second capacitor between said floating gate and said control gate, the respective capacitance values of the first and second capacitors being different, whereby a greater part of the second power supply voltage supplied across said pair of nodes in said store operation is applied across said tunnel capacitor.

3. A device as set forth in claim 2, wherein the thickness of said tunnel insulation layer is approximately 10 nm and the thickness of said insulation layer, between said floating gate and said control gate, is approximately 50 to 60 nm.

4. A semiconductor memory device including a memory cell array having a plurality of word lines extending in a first direction, a plurality of pairs of complementary bit lines extending in a second direction transverse to said first direction and defining plural intersections with said plurality of word lines and plural memory cells respectively corresponding to said plural intersections, each said memory cell being connected between the respectively associated word line and the respectively associated pair of complementary bit lines defining the corresponding intersection, and comprising:
- a volatile memory cell portion comprising a flip-flop having a pair of nodes respectively connected to a corresponding pair of said plural pairs of complementary bit lines and carrying out a data read/write operation between said pair of nodes of said flip-flop and said corresponding pair of bit lines wherein, when a high voltage of a predetermined value is applied to said flip-flop and correspondingly across said pair of nodes thereof, the respective voltages at said pair of nodes define a differential voltage therebetween which is set to substantially said predetermined high voltage value;
- a non-volatile memory cell portion respectively and individually associated with said volatile memory cell portion and including:
  - a capacitor circuit operatively connected to said volatile memory cell portion, said capacitor circuit comprising a tunnel capacitor and a further capacitor connected in series, at a series connection junction therebetween, across said pair of nodes, said differential voltage between said pair of nodes being applied thereby to said tunnel capacitor and said further capacitor, the portion of said differential voltage thus applied to said tunnel capacitor producing a tunnel effect in said tunnel capacitor,
  - a memory transistor provided separately from said tunnel capacitor and having a gate connected to said series connection junction of said tunnel capacitor and said further capacitor, said series connection junction being in a floating potential state and therefor at a potential which is not fixed at either a positive potential or a negative potential, and
  - a switching transistor connected between said memory transistor and one of said pair of nodes and being turned ON in response to a control signal of a predetermined level; and
- voltage supply means, connected to said flip-flop, for supplying a first power supply voltage during a read/write operation of said volatile memory cell portion and for supplying a second power supply voltage, higher than said first power supply voltage, across said pair of nodes of said flip-flop and thereby to said capacitor circuit, the second, higher power supply voltage and said control signal selectively storing data from said volatile memory cell portion in said nonvolatile memory cell portion and recalling data from said nonvolatile memory cell portion to said volatile memory cell portion.

* * * * *

UNITED STATES PATENT AND TRADEMARK OFFICE
CERTIFICATE OF CORRECTION

PATENT NO. : 5,189,641
DATED : February 23, 1993
INVENTOR(S) : Hideki ARAKAWA

It is certified that error appears in the above-indentified patent and that said Letters Patent is hereby corrected as shown below:

Col. 7, line 35, change "CRT" to --CR--;
line 66, after "voltage" insert --of--.

Col. 8, line 14, change "a" to --the--;
line 17, delete "(i.e., Figs. 6c and 6d)";
line 18, after "level" insert --(i.e., Figs. 6c and 6d)--;
line 21, change "Fig. 6c" to --Fig. 6e--;
line 23, change "Fig. 6c" to --Fig. 6e--.

Signed and Sealed this

Twenty-first Day of June, 1994

Attest:

BRUCE LEHMAN

*Attesting Officer*    *Commissioner of Patents and Trademarks*